(12) United States Patent
Shih

(10) Patent No.: US 7,016,202 B2
(45) Date of Patent: Mar. 21, 2006

(54) POWER ACTUATION STRUCTURE

(75) Inventor: Shoei-Yuan Shih, Taipei Hsien (TW)

(73) Assignee: Evserv Tech Corporation, Taipei Hsien (TW)

( * ) Notice: Subject to any disclaimer, the term of this patent is extended or adjusted under 35 U.S.C. 154(b) by 0 days.

(21) Appl. No.: 10/836,336

(22) Filed: May 3, 2004

(65) Prior Publication Data

US 2005/0243537 A1   Nov. 3, 2005

(51) Int. Cl.
*H02B 1/052* (2006.01)

(52) U.S. Cl. .................. 361/828; 361/832; 361/837; 361/788; 361/796

(58) Field of Classification Search ............ 361/788, 361/796, 728, 730, 752, 754, 756, 741, 802, 361/798, 797, 828, 832, 837
See application file for complete search history.

(56) References Cited

U.S. PATENT DOCUMENTS

| | | | | |
|---|---|---|---|---|
| 4,454,552 A | * | 6/1984 | Barnes et al. ................. | 361/9 |
| 5,652,508 A | * | 7/1997 | Yamamoto .................. | 324/166 |
| 5,822,197 A | * | 10/1998 | Thuault ....................... | 361/803 |
| 6,535,677 B1 | * | 3/2003 | Tanaka et al. .............. | 385/123 |
| 6,577,507 B1 | * | 6/2003 | Yamaguchi et al. ......... | 361/754 |
| 6,625,033 B1 | * | 9/2003 | Steinman ..................... | 361/753 |
| 6,768,043 B1 | * | 7/2004 | Chory et al. ................ | 800/290 |
| 6,768,643 B1 | * | 7/2004 | Rust et al. .................. | 361/732 |

* cited by examiner

*Primary Examiner*—Kamand Cuneo
*Assistant Examiner*—Dameon E. Levi
(74) *Attorney, Agent, or Firm*—Birch, Stewart, Kolasch & Birch, LPP

(57) ABSTRACT

A power actuation structure for turning electric power ON and OFF of a computer host through an extension mechanism without wiring includes a switch located on a circuit board of the computer host. The computer host has partitions to define installation areas for holding electronic devices. Each of the partitions has a displacement section corresponding to the switch. The displacement section has an actuator which may be driven to compress the switch to set the electric power ON or OFF.

6 Claims, 7 Drawing Sheets

POWER ACTUATION STRUCTURE

FIELD OF THE INVENTION

The present invention relates to a power actuation structure and particularly to a power actuation structure adopted for use on a server or a computer host of a disk drive array for controlling electric power ON and OFF of electronic devices.

BACKGROUND OF THE INVENTION

A conventional host for industrial use usually is installed in a host cabinet of 19 inches wide to meet the modularized requirement. There is a commonly accepted industrial standard unit 1U which defines a space at the dimension of 19 inches long, 19 inches wide and 1.75 inches high. This standard provides great convenience for modular design and configuration. In response to the requirements of high speed network, the number of hard disk drives in the host increases rapidly. The function of the main board and connection interface also have to expand. Hence many more standards have been developed based on the standard unit 1U, such as 2U and 3U that have the height of 3 inches and 4.5 inches. There are even 4U and 5U specifications that provide more space to accommodate larger hosts.

Whatever the host specifications, design of the power actuation structure always is a troublesome issue. As the switch for controlling ON and OFF of electric power is located on the host circuit board, the present methods generally have a connection line such as the power cord to link electric signals at the front end or rear end of the host. There is a button at the connection juncture of the power cord to control ON and OFF. However, if the button is located at the front end of the host, as the front end of the host is fully occupied by the retrieval electronic devices such as hard disk drives or optical disk drive, there is no enough space to accommodate the power cord. Hence the current practice is to install the button at the rear end of the host. While such an approach overcomes the wiring and space constraints, the rear end of the host generally is close to the wall. Hence users have to move the host every time to set the button ON or OFF. In the event that a whole set of hosts are mounted in a cabinet, to move the entire cabinet could become an overwhelming task for one operator. Moreover, wiring and covering of the power cords also are difficult. Thus how to improve power actuation structure is an issue pending to be resolved.

SUMMARY OF THE INVENTION

Therefore the primary object of the invention is to resolve the aforesaid disadvantages. The invention provides a power actuation structure that has a switch installed on a host circuit board without additional wiring. An extension mechanism is provided to actuate electric power. The switch for controlling ON and OFF of the host electric power is located on the circuit board. The host has partitions to define installation areas of electronic devices. Each partition has a displacement section to hold an actuator which can depress the switch to set the power ON or OFF.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
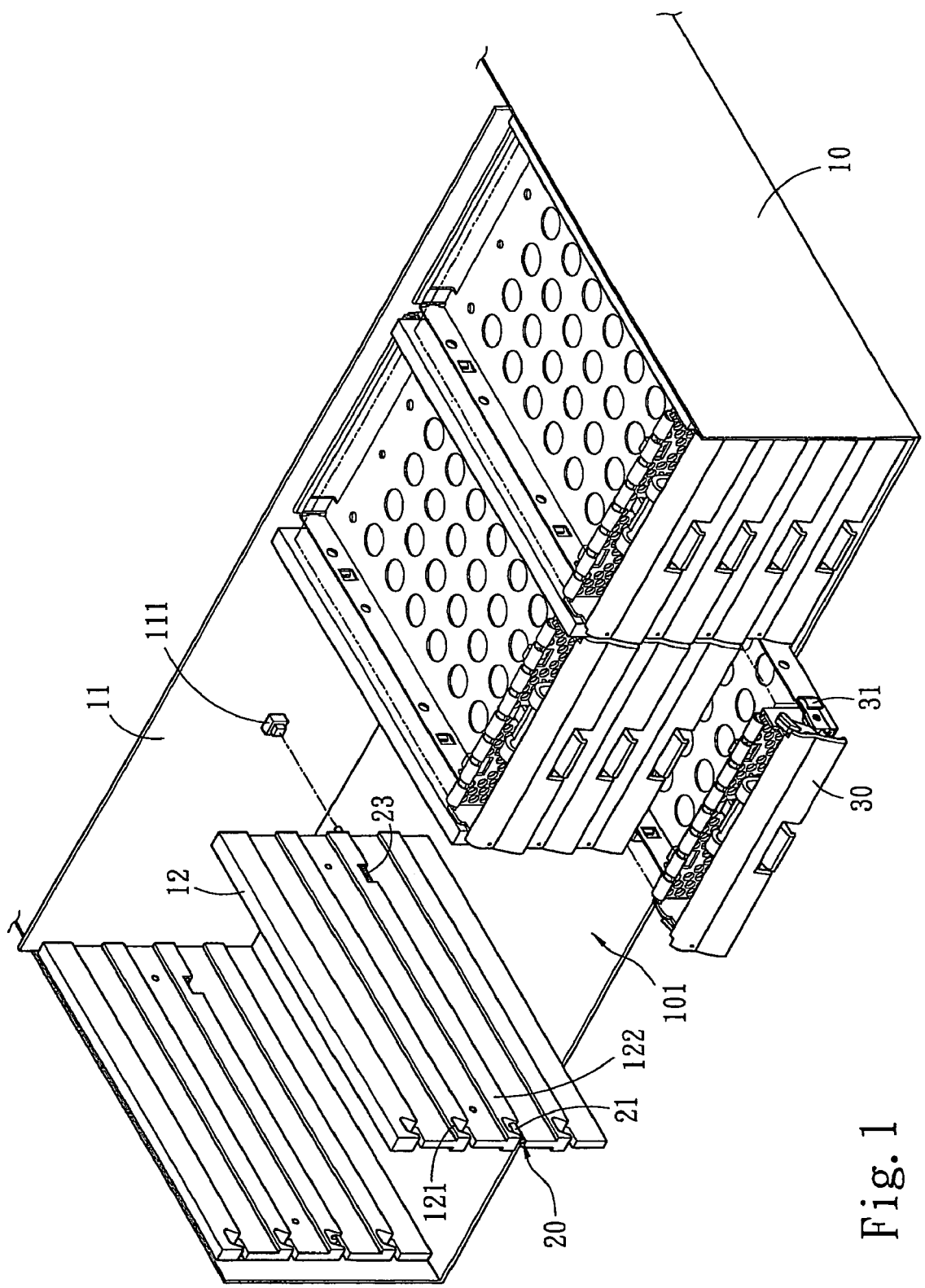
FIG. 1 is a schematic view of the present invention installed in a host.
Figure 2:
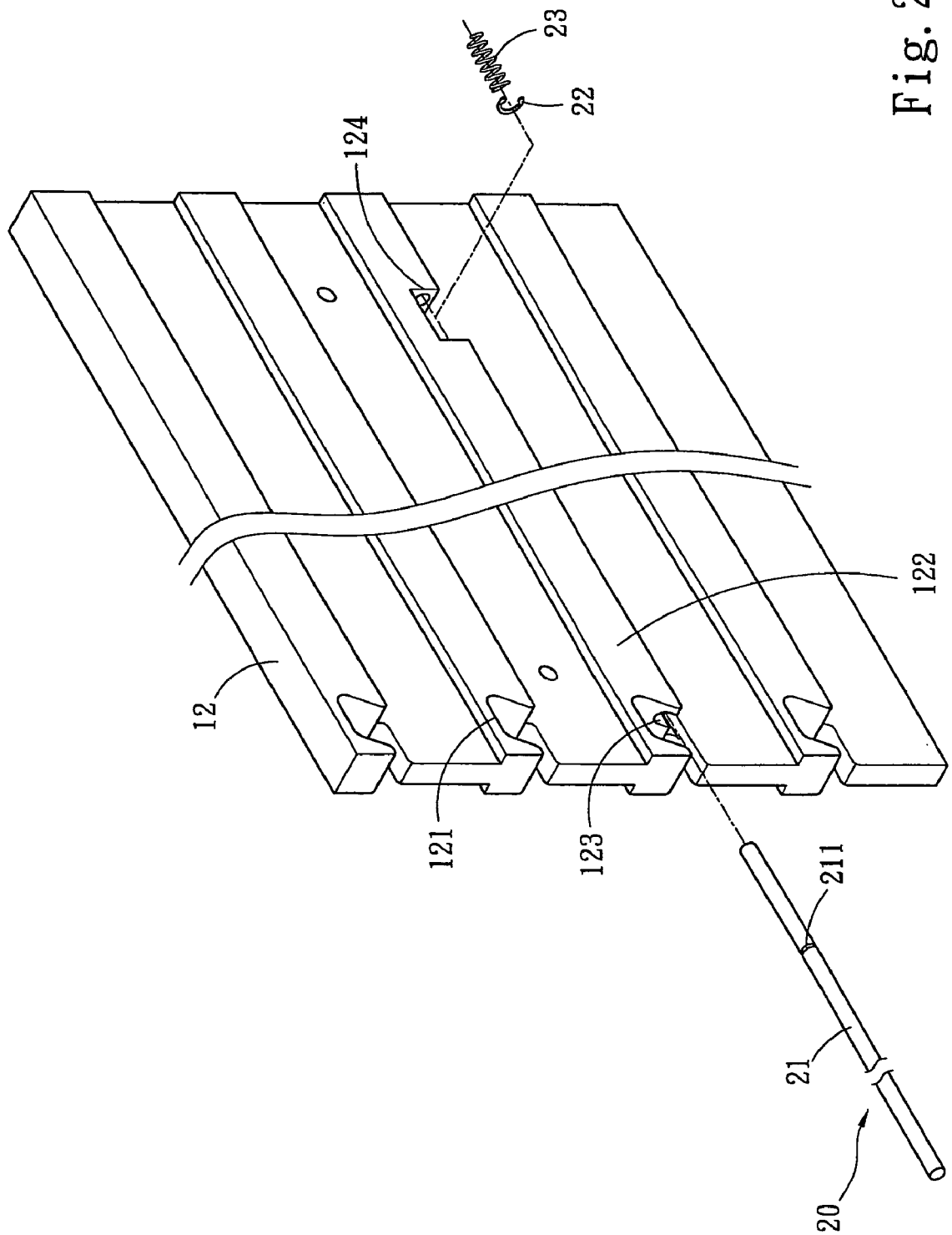
FIG. 2 is an exploded view of the power actuation structure of the invention.

Please refer to FIGS. 1 and 2 for a host 10 and a power actuation structure according to present invention. The invention is adopted for use on a server or the host 10 that includes a disk drive array. The host 10 has a circuit board 11 which has a switch 111 for controlling ON and OFF of the electric power of the host 10. The invention employs an extension mechanism to replace the conventional wiring. The host 10 has a plurality of existing partitions 12 to divide the host 10 into installation areas 101 to hold electronic devices 30 (such as hard disk drives, optical disk drives and the like that are retrievable). Each of the partitions 12 has a stage section 122 which has sliding tracks to form the installation areas 101. The partition 12 has a retaining section 121 at the front end. The electronic device 30 has a latch section 31 corresponding to the retaining section 121 so that the electronic device 30 may be latched and anchored after having been placed in the installation area 101. The partition 12 further has a displacement section 123 corresponding to the switch 111. There is an actuator 20 located in the displacement section 123 to depress the switch 111. The displacement section 123 has a holding area 124. The actuator 20 includes a compression rod 21 running through the displacement section 123 and an elastic element 23 located in the holding area 124 coupling on the compression rod 21. The compression rod 21 has a groove 211 corresponding to the holding area 124 to couple with a clip ring 22 to press the elastic element 23.

Figure 3A:
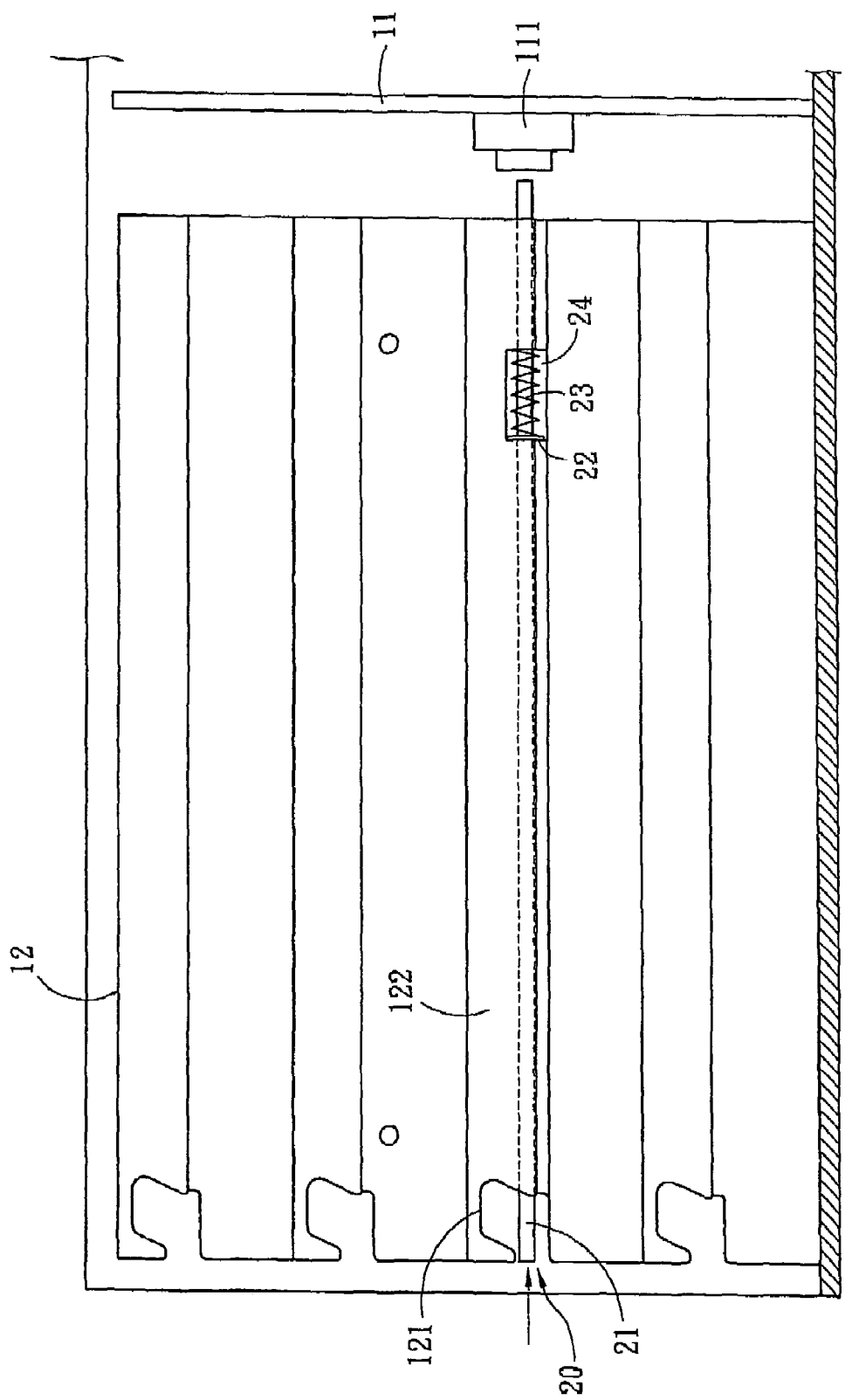
FIGS. 3A and 3B are schematic views of the invention in operating conditions.
Figure 3B:
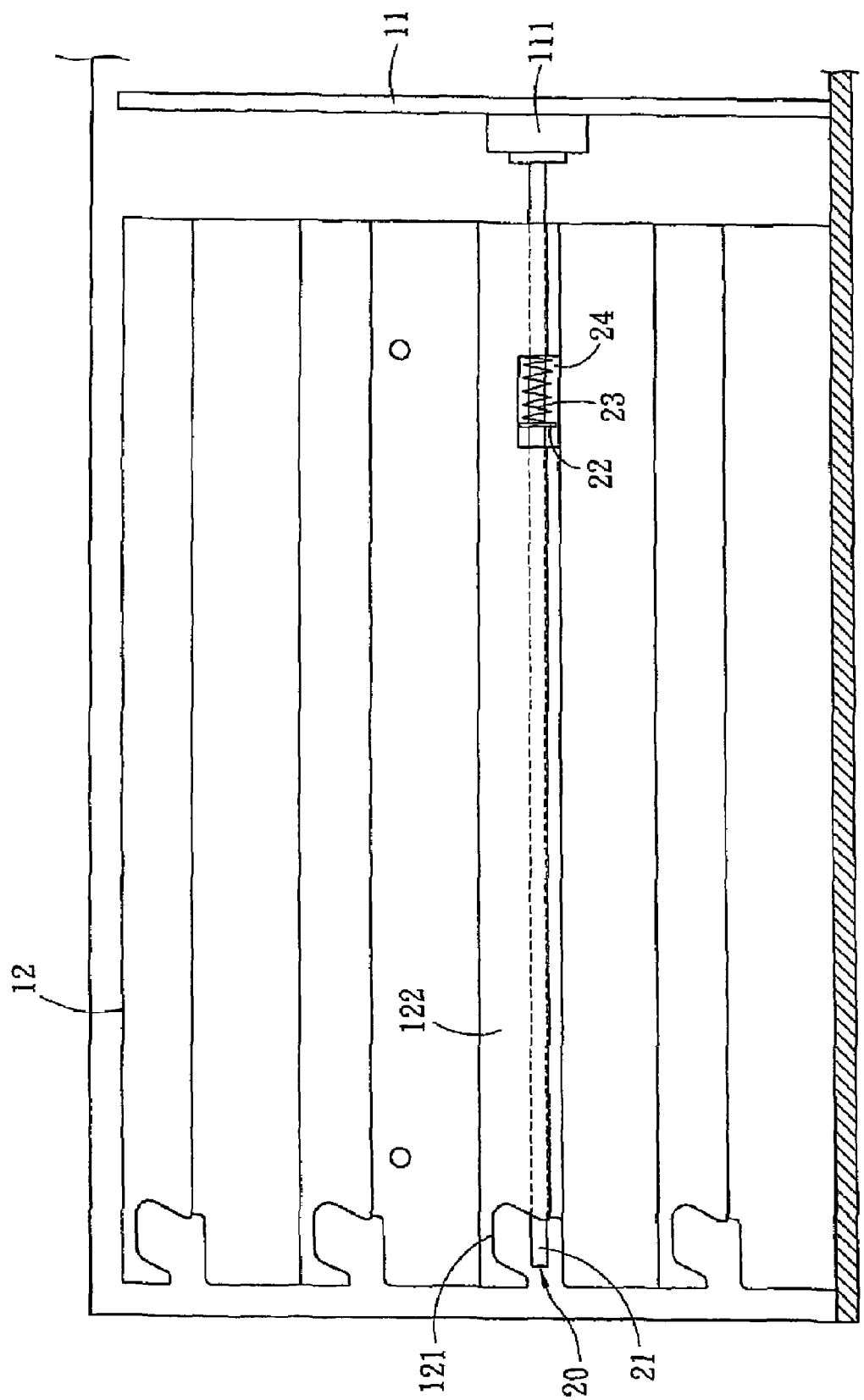

Refer to FIGS. 3A and 3B for the invention installing in the host 10. After the electronic device 30 has been installed on the installation area 101, if a user wants to start the host 10 for operation, he/she directly depresses the compression rod 21 of the actuator 20. The compression rod 21 is moved rearwards in the displacement section 123 to push the switch 111 on the circuit board 11 to activate the host 10 to start operation; meanwhile the clip ring 22 on the compression rod 21 pushes the elastic element 23 to store elastic force. When the force on the compression rod is released, the elastic force of the elastic element 23 is released to push the compression rod 21 to its original position. To stop host operation, depress the compression rod 21 again as previously discussed to trigger the switch on the circuit board 11, electric power may be cut off to end operation of the host 10.

By means of the construction set forth above, turning ON and OFF of the switch 111 on the circuit board 11 is accomplished through the corresponding actuator 20. Thus there is no wiring problem that occurs to the conventional techniques. The invention may be fabricated easily to save the complicated wiring and configuration process of the conventional approach.

Figure 4:
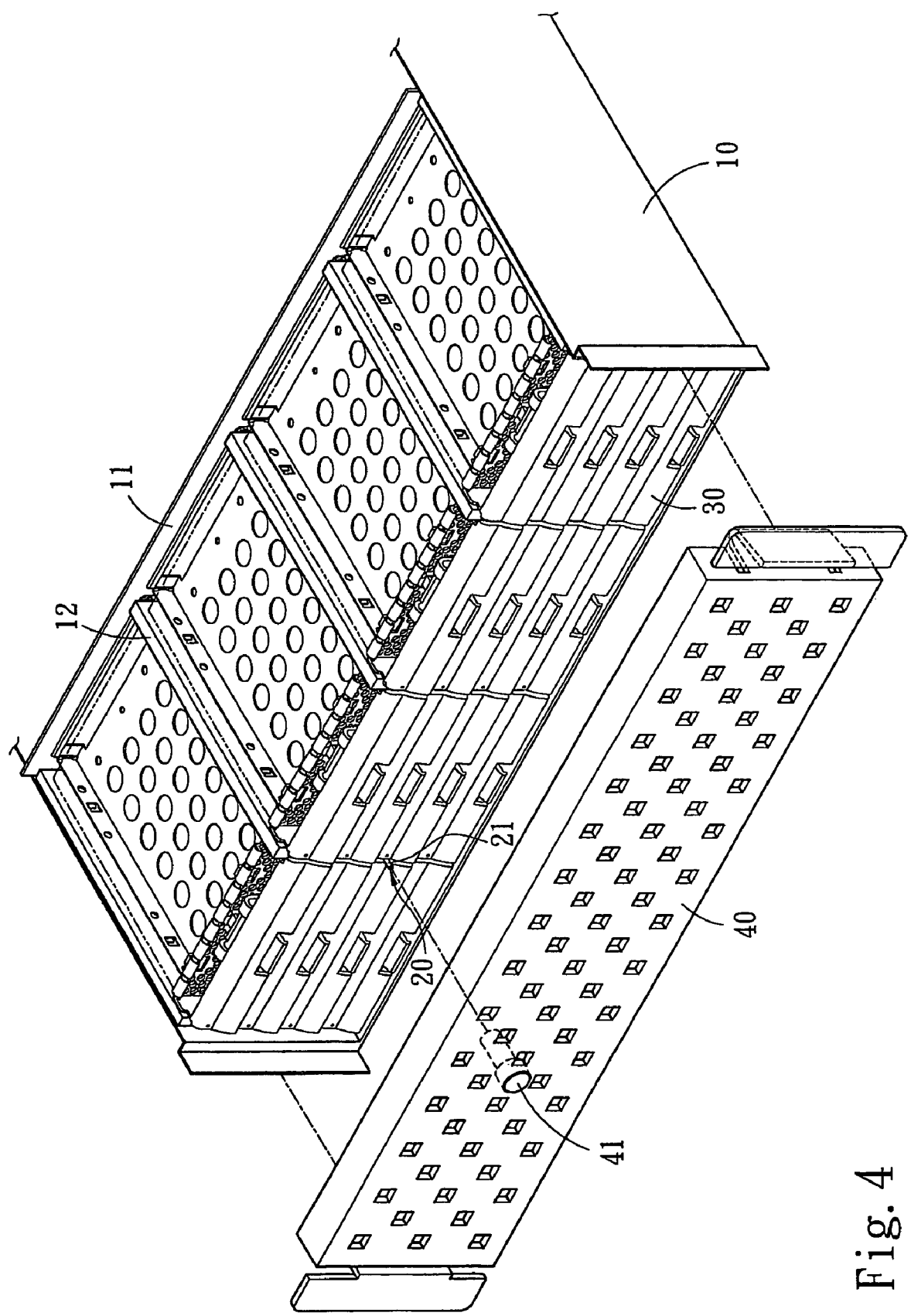
FIG. 4 is a schematic view of the invention installed on a host with a face plate.
Figure 5A:
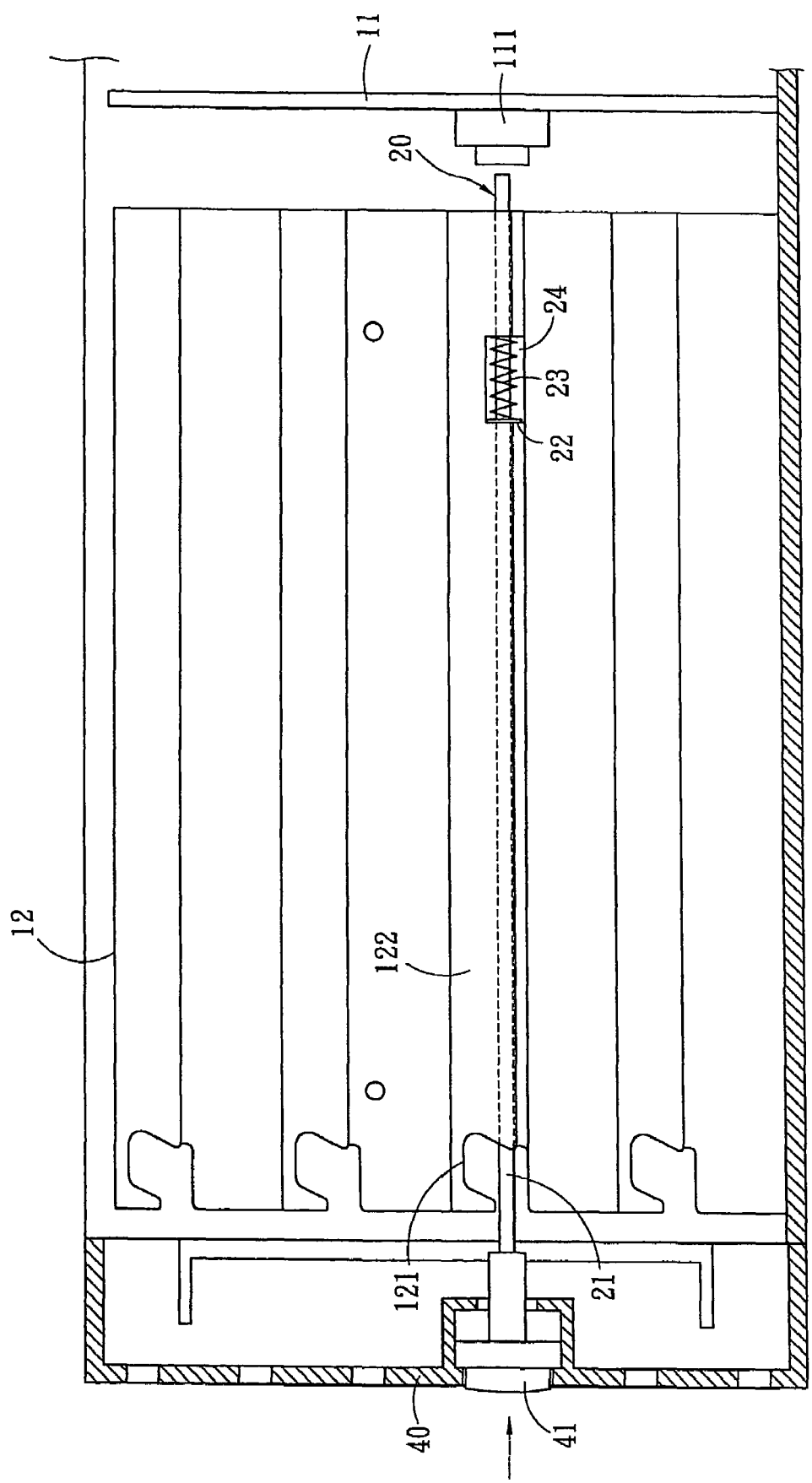
FIGS. 5A and 5B are schematic views of the invention according to FIG. 4 in operating conditions.
Figure 5B:
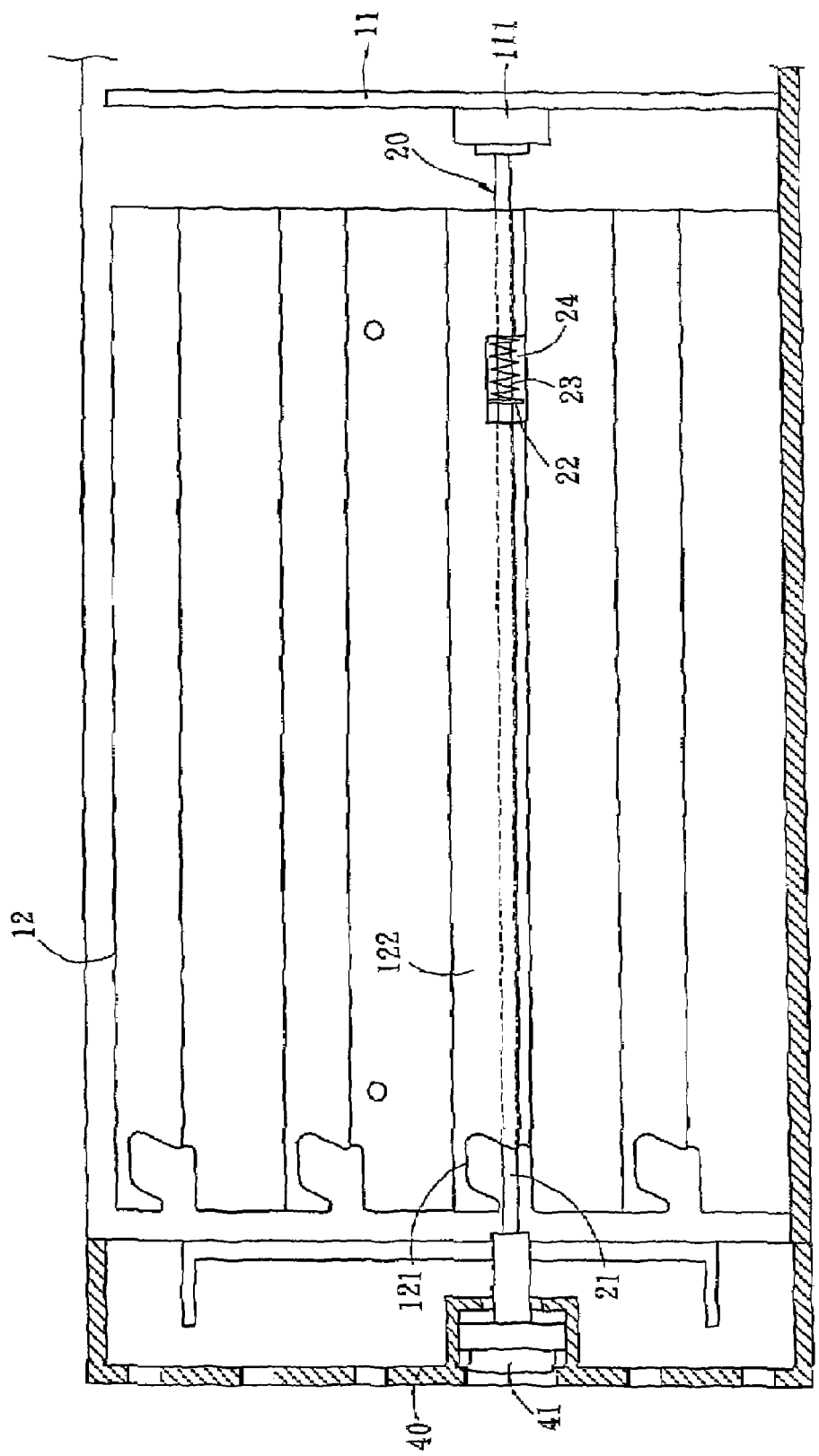

Referring to FIG. 4 for another embodiment of the invention adopted for use on the host 10 that has a face plate 40. The face plate 40 has a pushbutton 41 corresponding to the actuator 20. Referring to FIGS. 5A and 5B, when the pushbutton 41 receives a force, the compression rod 21 is pushed rearwards to trigger the switch 111 and set the host 10 ON or OFF.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A power actuation structure comprising a circuit board in a computer host, and a switch located on the circuit board corresponding to the power actuation structure to control ON and OFF of electric power of the computer host, comprising:

a plurality of partitions to define installation areas for holding electronic devices in the computer host, at least one of the partitions having a displacement section for housing an actuator to depress the switch, the partition having a stage section which has sliding tracks to form the installation areas and the displacement section having a holding area, the actuator including a compression rod running through the displacement section and an elastic element located in the holding area coupling on the compression rod, the compression rod having a groove within the holding area to which a clip ring is attached, the elastic element pressing against the clip ring.

2. The power actuation structure of claim 1, wherein the partition has a retaining section at a front end thereof, the electronic device having a latch section corresponding to the retaining section.

3. The power actuation structure of claim 1, wherein the computer host has a face plate on a front end, the face plate having a pushbutton corresponding to the actuator.

4. The power actuation structure of claim 1, wherein the displacement section is located within the at least one partition between a top and bottom of the at least one partition.

5. The power actuation structure of claim 1, wherein the at least one partition has the displacement section extending from a front side to a rear side thereof without extending beyond the at least one partition and the installation areas.

6. The power actuation structure of claim 1, wherein the at least one partition has a plurality of sliding tracks on both sides for holding a plurality of electronic devices on each side thereof.

* * * * *